(12) United States Patent
Lu et al.

(10) Patent No.: US 12,159,827 B2
(45) Date of Patent: Dec. 3, 2024

(54) MIDDLE END OF LINE DECOUPLING CAPACITORS FOR SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Chung-Ting Lu, Kaohsiung (TW); Chih-Chiang Chang, Taipei (TW); Chung-Chieh Yang, Zhubei (TW); Yung-Chow Peng, Hsinchu (TW)

(73) Assignee: TAIWAN SEMICONDUCTOR MANUFACTURING COMANY, LTD., Hsinchu (TW)

( * ) Notice: Subject to any disclaimer, the term of this patent is extended or adjusted under 35 U.S.C. 154(b) by 0 days.

(21) Appl. No.: 18/446,873

(22) Filed: Aug. 9, 2023

(65) Prior Publication Data

US 2023/0386994 A1    Nov. 30, 2023

Related U.S. Application Data

(62) Division of application No. 17/533,017, filed on Nov. 22, 2021, now Pat. No. 11,854,960.

(Continued)

(51) Int. Cl.
*H01L 23/522* (2006.01)
*H01L 21/8234* (2006.01)
(Continued)

(52) U.S. Cl.
CPC .. *H01L 23/5223* (2013.01); *H01L 21/823475* (2013.01); *H01L 23/5286* (2013.01); *H01L 27/0688* (2013.01)

(58) Field of Classification Search
CPC ......... H01L 23/5223; H01L 21/823475; H01L 23/5286; H01L 27/0688; H01L 27/0207;
(Continued)

(56) References Cited

U.S. PATENT DOCUMENTS

2010/0078695 A1    4/2010  Law et al.
2013/0181269 A1*   7/2013  Chen ...................... H01L 29/94
                                                     257/E29.345
(Continued)

FOREIGN PATENT DOCUMENTS

DE    11 2011 106 049 B4    2/2018
WO    WO-2013/095651 A1     6/2013

OTHER PUBLICATIONS

Office Action issued in connection with Korean Appl. No. 10-2022-0004189 dated Apr. 16, 2024.

(Continued)

*Primary Examiner* — Duy T Nguyen
(74) *Attorney, Agent, or Firm* — FOLEY & LARDNER LLP

(57) ABSTRACT

A semiconductor device includes an active region over a substrate extending along a first lateral direction. The semiconductor device includes a number of first conductive structures operatively coupled to the active region. The first conductive structures extend along a second lateral direction. The semiconductor device includes a number of second conductive structures disposed above the plurality of first conductive structures. The second conductive structures extend along the first lateral direction. The semiconductor device includes a first capacitor having a first electrode and a second electrode. The first electrode includes one of the first conductive structures and the active region, and the second electrode includes a first one of the second conductive structures. Each of the active region and the first (Continued)

conductive structures is electrically coupled to a power rail structure configured to carry a supply voltage.

19 Claims, 11 Drawing Sheets

Related U.S. Application Data

(60) Provisional application No. 63/142,033, filed on Jan. 27, 2021.

(51) Int. Cl.
*H01L 23/528* (2006.01)
*H01L 27/06* (2006.01)

(58) Field of Classification Search
CPC ..... H01L 28/60; H01L 29/94; H01L 27/0629; H01L 27/0886; H01L 27/0924; H01L 27/105
USPC ........................................................ 438/396
See application file for complete search history.

(56) References Cited

U.S. PATENT DOCUMENTS

| | | | |
|---|---|---|---|
| 2013/0207199 A1* | 8/2013 | Becker | H01L 27/0886 257/369 |
| 2017/0033013 A1* | 2/2017 | Kim | H01L 21/30604 |
| 2020/0091145 A1 | 3/2020 | Guha et al. | |
| 2020/0258784 A1 | 8/2020 | Wang et al. | |
| 2020/0365586 A1* | 11/2020 | Shin | H01L 27/0886 |
| 2021/0083129 A1* | 3/2021 | Liu | H01L 29/94 |

OTHER PUBLICATIONS

Final Office Action on U.S. Appl. No. 17/533,017 Dtd Jul. 5, 2023.
German Office Action issued in connection with DE Appl. Ser. No. 102022100460 dated Feb. 2, 2023, without English translation (10 pages).
Non-Final Office Action on U.S. Appl. No. 17/533,017 Dtd Mar. 23, 2023.

* cited by examiner

MIDDLE END OF LINE DECOUPLING CAPACITORS FOR SEMICONDUCTOR DEVICES AND METHODS OF MANUFACTURING THEREOF

CROSS-REFERENCE TO RELATED APPLICATION

This application is a divisional of U.S. patent application Ser. No. 17/533,017, filed Nov. 22, 2021 (now U.S. Pat. No. 11,854,960), which claims priority to and the benefit of U.S. Provisional Application No. 63/142,033, filed Jan. 27, 2021, both of which are incorporated herein by reference in their entireties for all purposes.

BACKGROUND

During the operation of certain integrated circuits, power supply lines may supply transient currents with a relatively high intensity. These conditions can result in noise on the power supply lines. For example, the voltage on the power supply line may fluctuate when the transition time of the transient current is particularly short or when the line's parasitic inductance or parasitic resistance is large. To ameliorate such conditions, decoupling capacitors are typically used, acting as temporary charge reservoirs to prevent momentary fluctuations in supply voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
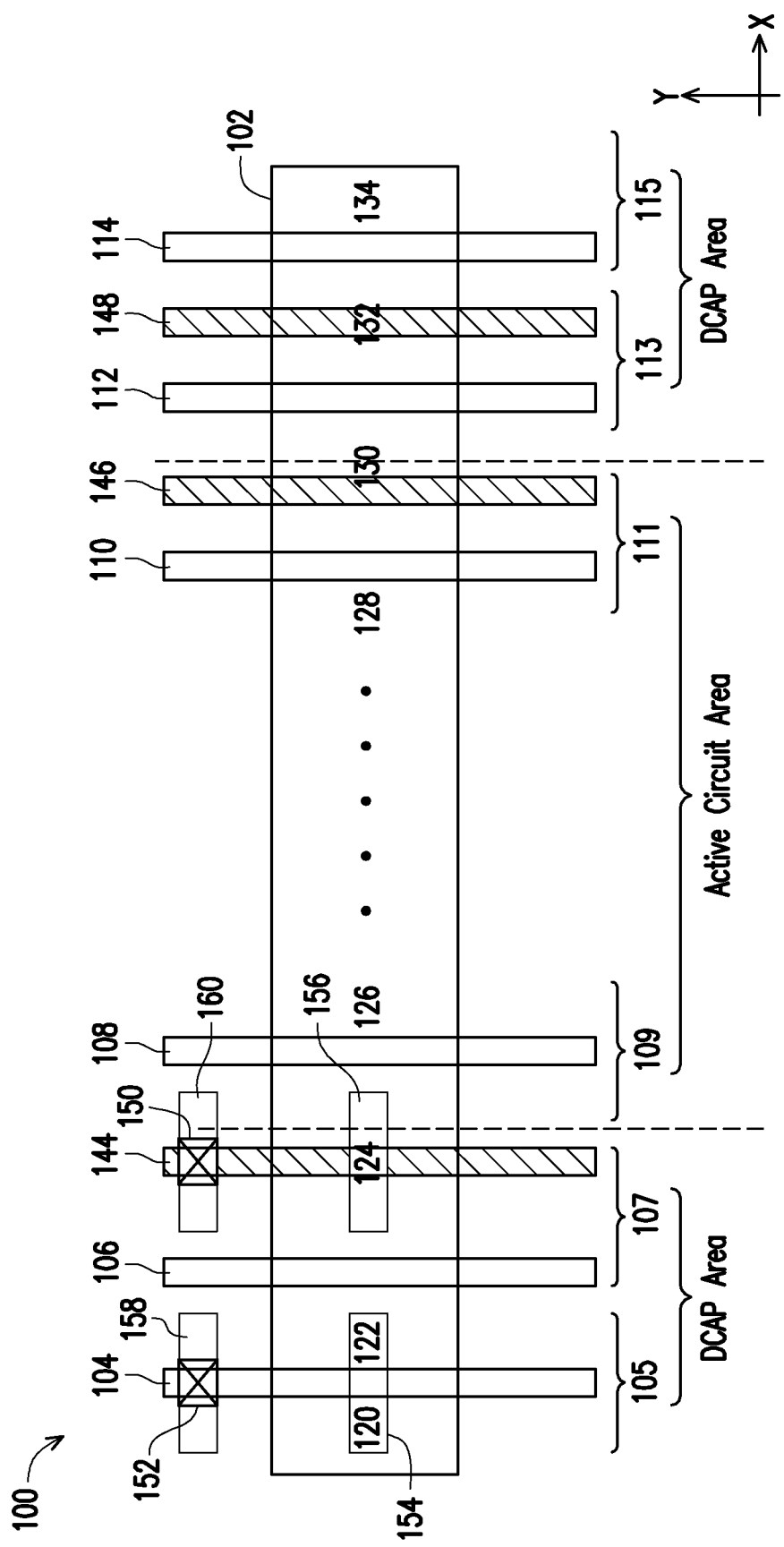
FIG. 1 illustrates an example layout design of a semiconductor device that includes a number of interlayer decoupling capacitors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of integrated circuits, and some of these involve capacitors. During the operation of certain circuits, power supply lines (sometimes referred to as power rails) may supply transient currents with a relatively high intensity. These conditions can result in noise on the power supply lines. The voltage on the power supply line may fluctuate when the transition time of the transient current is particularly short or when the line's parasitic inductance or parasitic resistance is large. To ameliorate such conditions, decoupling capacitors may be used, acting as temporary charge reservoirs to prevent momentary fluctuations in supply voltage.

In general, an integrated circuit has a number of circuits, some of which may be formed by a first type of devices (e.g., transistors) that operate under a relatively low voltage (e.g., not higher than 0.9 volts (V)), and some of which may be formed by a second type of devices (e.g., transistors) that operate under a relatively high voltage (e.g., around 1.2V). The first type of transistors may sometimes be referred to as core transistors; and the second type of transistor may sometime be referred to as input/output (I/O) transistors. The circuits formed by the core transistors may include, for example, logic circuits, static random access memory (SRAM) circuits, and/or ring oscillators (ROs); and the circuits formed by the I/O transistors may include, for example, input/output (I/O) circuits, and/or serializer/deserializer (SerDes).

The core transistors are typically formed in a relatively denser area of a substrate (sometimes referred to as a core area), while the I/O transistors are typically formed in a relatively sparser area of the substrate (sometimes referred to as an I/O area). Over the core area, a number of interconnect structures, operatively coupled to the core transistors, can be formed in a relatively higher density; and over the I/O area, a number of interconnect structures, operatively coupled to the I/O transistors, can be formed in a relatively lower density. In the existing technologies, the decoupling capacitors are commonly formed by the interconnect structures within a same layer (sometimes referred to as intralayer decoupling capacitors) in the I/O area to minimize leakage current, even with a trade-off of a lower density. While evolving into the next generation of technology nodes (of transistors), concepts of replacing I/O transistors with core transistors (i.e., including only core transistors over a substrate) have been proposed to further increase an integration density of the transistors. As such, the decoupling capacitors formed by the interconnect structures within the same layer in such universal core areas disadvantageously encounter various issues such as, for example, undesirable high leakage current. Thus, decoupling capacitors on certain integrated circuits have not been entirely satisfactory to date and may pose increasing problems in the near future.

The present disclosure provides various embodiments of a number of decoupling capacitors, each of which is formed across various layers of a semiconductor device. In various embodiments, such a decoupling capacitor may sometimes be referred to as a cross-layer decoupling capacitor, a vertically integratable decoupling capacitor, or an interlayer decoupling capacitor. For example, a first decoupling capacitor may include a first electrode that is an interconnect structure disposed in the bottommost one of a number of back-end-of-line (BEOL) layers and a second electrode that is one of a number of interconnect structures within a middle-end-of-line (MEOL) layer, typically one layer below the bottommost BEOL layer. A second decoupling capacitor may include a first electrode that is the interconnect structure M0 and a second electrode that is a conductive structure (e.g., a metal gate structure) within a front-end-of-line (FEOL) layer, typically one layer below the MEOL layer. A third decoupling capacitor may include a first electrode that is the interconnect structure M0 and a second electrode that is a conductive structure/region (e.g., epitaxial source/drain structures) within the FEOL layer.

By vertically integrating conductive structures across different layers to form the interlayer decoupling capacitors, as disclosed herein, a density of the total decoupling capacitors can significantly increase within a certain area of a substrate. For example, in an integrated circuit that only has core transistors, dimensions (e.g., widths) of the interconnect structures in the BEOL layers typically shrink with dimensions of the core transistors accordingly to account for the lower operation voltage of the transistors in the FEOL layer. By incorporating the interlayer decoupling capacitors into the total decoupling capacitors, a density of the decoupling capacitors can be increased by at least 1.3 times than the scenario that only includes intralayer decoupling capacitors. Even in some scenarios where the dimensions of the BEOL interconnect structures do not shrink accordingly, with the interlayer decoupling capacitors, a density of the decoupling capacitors can be increased by at least 1.7 times than the scenario that only includes intralayer decoupling capacitors. Further, by tying one of the electrodes of each the disclosed decoupling capacitors to a power supply, leakage current, if any, induced by the decoupling capacitor can significantly decrease. Thus, the trade-off between the density and leakage current of decoupling capacitors that the existing technologies commonly face can be avoided.

Referring first to FIG. 1, an example layout design 100 of a portion of a semiconductor device (e.g., an integrated circuit) is depicted, in accordance with various embodiments. The layout design 100 may be used to fabricate at least a portion of a semiconductor device that includes one or more of the disclosed interlayer decoupling capacitors. It should be understood that the layout design 100 is simplified for purposes of illustration and thus, the layout design 100 of FIG. 1 is not limited to any circuit and can include any of various other patterns/features, while remaining within the scope of the present disclosure.

The semiconductor device that can be fabricated out of the layout design 100 may include an active region. Such an active region may be a fin-shaped structure of one or more fin field-effect-transistors (FinFETs), a number of nanostructures (e.g., nanosheets, nanowires, etc.) of one or more gate-all-around (GAA) transistors, or an oxide-definition/diffusion (OD) region of one or more planar metal-oxide-semiconductor field-effect-transistors (MOSFETs), in which the active region may serve as a channel, a source feature, or a drain feature of the respective transistor(s). In some embodiments, the transistors formed in the active region may operate under a relatively low voltage, e.g., not higher than 0.9 volts (V). Such transistors are sometimes referred to as "core transistors."

As shown in FIG. 1, the layout design 100 includes a pattern 102. The pattern 102 may extend along a first lateral direction (e.g., the X axis in FIG. 1). In some embodiments, the pattern 102 is configured to form an active region over a substrate, hereinafter "active region pattern 102." The active region pattern 102 may be characterized with a conduction type, for example, a p-type doped region or an n-type doped region. The layout design 100 can be used to form a number of transistors in various configurations. In one example where the transistors are to be formed as FinFETs, the active region pattern 102 may be used to form a p-type or n-type fin-based structure over a substrate. In another example where the transistor are to be formed as GAA transistors, the active region pattern 102 may be used to form one or more p-type or n-type nanostructures stacked on top of one another over a substrate. In yet another example where the transistors are to be formed as planar MOSFETs, the active region pattern 102 may be used to form a p-type or n-type region recessed in a substrate (e.g., a well).

The layout design 100 further includes patterns 104, 106, 108, 110, 112, and 114. The patterns 104 to 114 may extend along a second lateral direction (e.g., the Y axis of FIG. 1). Although the patterns 104-114 are each shown as a continuous pattern extending along the Y axis in FIG. 1, it should be understood that the patterns 104-114 can each be "cut" into a number of segments (based on functionality of the completed semiconductor device), while remaining within the scope of the present disclosure. The patterns 104 to 114 are each configured to form a gate structure, hereinafter "gate structure pattern 104," "gate structure pattern 106," "gate structure pattern 108," "gate structure pattern 110," "gate structure pattern 112," and "gate structure pattern 114," respectively. Each of the gate structure patterns 104 to 114 can overlay a respective portion of the active region pattern 102 to define one device (e.g., transistor).

In accordance with various embodiments, the gate structure patterns (e.g., 104, 106, 112, 114) disposed closer to either side of the active region pattern 102 may be configured to form transistors that can at least in part form one or more of the interlayer decoupling capacitors of the semiconductor device, and the gate structure patterns (e.g., 108, 110) disposed farther from either side of the active region pattern 102 may be configured to form transistors that can at least in part form one or more active circuits of the semiconductor device. Hereinafter, the area that houses the gate structure patterns 104, 106, 112 and 114 may sometimes be referred to as "decoupling capacitor (DCAP) area," and the area that houses the gate structure patterns 108 and 110 may sometimes be referred to as "active circuit area."

For example, the portion of the gate structure pattern 104 that overlays the active region pattern 102 can define the gate feature of a transistor 105, and the portions of the active region pattern 102 that are disposed on the left-hand side (120) and right-hand side (122) of the gate structure pattern 104 can define the source and drain features of the transistor 105, respectively. The portion of the gate structure pattern 106 that overlays the active region pattern 102 can define the gate feature of a transistor 107, and the portions of the active region pattern 102 that are disposed on the left-hand side (122) and right-hand side (124) of the gate structure pattern 106 can define the source and drain features of the transistor 107, respectively. The portion of the gate structure pattern 108 that overlays the active region pattern 102 can define the gate feature of a transistor 109, and the portions of the active region pattern 102 that are disposed on the left-hand side (124) and right-hand side (126) of the gate structure pattern 108 can define the source and drain features of the transistor 109, respectively. The portion of the gate structure pattern 110 that overlays the active region pattern 102 can define the gate feature of a transistor 111, and the portions of the active region pattern 102 that are disposed on the left-hand side (128) and right-hand side (130) of the gate structure pattern 110 can define the source and drain features of the transistor 111, respectively. The portion of the gate structure pattern 112 that overlays the active region pattern 102 can define the gate feature of a transistor 113, and the portions of the active region pattern 102 that are disposed on the left-hand side (130) and right-hand side (132) of the gate structure pattern 112 can define the source and drain features of the transistor 113, respectively. The portion of the gate structure pattern 114 that overlays the active region pattern 102 can define the gate feature of a transistor 115, and the portions of the active region pattern 102 that are disposed on the left-hand side (132) and right-hand side (134) of the gate structure pattern 114 can define the source and drain features of the transistor 115, respectively.

The layout design 100 further includes patterns 144, 146, and 148. The patterns 144, 146, and 148 may extend along the second lateral direction (e.g., the Y axis in FIG. 1), i.e., in parallel with the gate structure patterns 104-114. Further, the patterns 144-148 may be sandwiched between adjacent ones of the gate structure patterns 104-114. Although the patterns 144-148 are each shown as a continuous pattern extending along the Y axis in FIG. 1, it should be understood that the patterns 144-148 can each be "cut" into a number of segments (based on functionality of the completed semiconductor device), while remaining within the scope of the present disclosure. The patterns 144, 148, and 150 are each configured to form a source/drain interconnect structure (e.g., "MD"), hereinafter "MD pattern 144," "MD pattern 146," and "MD pattern 148." In some embodiments, each of the MD patterns 144-148 may electrically couple the source or drain feature of a corresponding transistor to one or more upper-level interconnect structures, which will be discussed in further detail below. As a non-limiting example, the MD pattern 144 can electrically couple the source/drain feature (e.g., formed by the portion 124) to an upper-level interconnect structure.

The layout design 100 further includes a pattern 150. The pattern 150 is configured to form a via interconnect structure (e.g., VD), hereinafter "VD pattern 150." The via interconnect structure formed by the VD pattern 150 may extend along a vertical direction (e.g., a direction perpendicular to the X axis and the Y axis) with a height in order to electrically couple a corresponding MD (e.g., formed by the MD pattern 144) to an upper-level interconnect structure. The layout design 100 further includes a pattern 152. The pattern 152 is configured to form a via interconnect structure (e.g., VG), hereinafter "VG pattern 152." The via interconnect structure formed by the VG pattern 152 may extend along a vertical direction (e.g., a direction perpendicular to the X axis and the Y axis) with a height in order to electrically couple a corresponding gate structure (e.g., formed by the gate structure pattern 104) to an upper-level interconnect structure.

According to various embodiments of the present disclosure, the features of the transistors (e.g., gate features 104-114, source/drain features 120-134) are referred to as being formed in a front-end-of-line (FEOL) layer. The interconnect structures formed by the MD patterns 142-148, VD pattern 150, and VG pattern 152 are referred to as being formed in a middle-end-of-line (MEOL) layer, which is disposed above the FEOL layer. Further above the MEOL layer, a number of back-end-of-line (BEOL) layers (e.g., about 10) can be formed. Each BEOL layer can include a number of interconnect structures to electrically couple the transistors.

For example, the layout design 100 further includes patterns 154, 156, 158, and 160. The patterns 154 to 160 may extend along the first lateral direction (e.g., the X axis of FIG. 1). Although the patterns 154-160 are each shown as a segmental pattern in the example of FIG. 1, it should be understood that the layout design 100 can include any number of other similar patterns continuously extending along the whole (active region) pattern 102 based on functionality of the completed semiconductor device, while remaining within the scope of the present disclosure. The patterns 154 to 160 are each configured to form an interconnect structure at the bottommost one of the BEOL layers (e.g., M0), hereinafter "M0 pattern 154," "M0 pattern 156," "M0 pattern 158," and "M0 pattern 160," respectively. In accordance with various embodiments, the interconnect structures in the BEOL layers formed by some of the M0 patterns 154 to 160 can overlay at least one structure/feature in the FEOL or MEOL layer (with the respective patterns overlapped with each other) to form the disclosed interlayer decoupling capacitors, which will be discussed in further detail below.

Figure 2A:
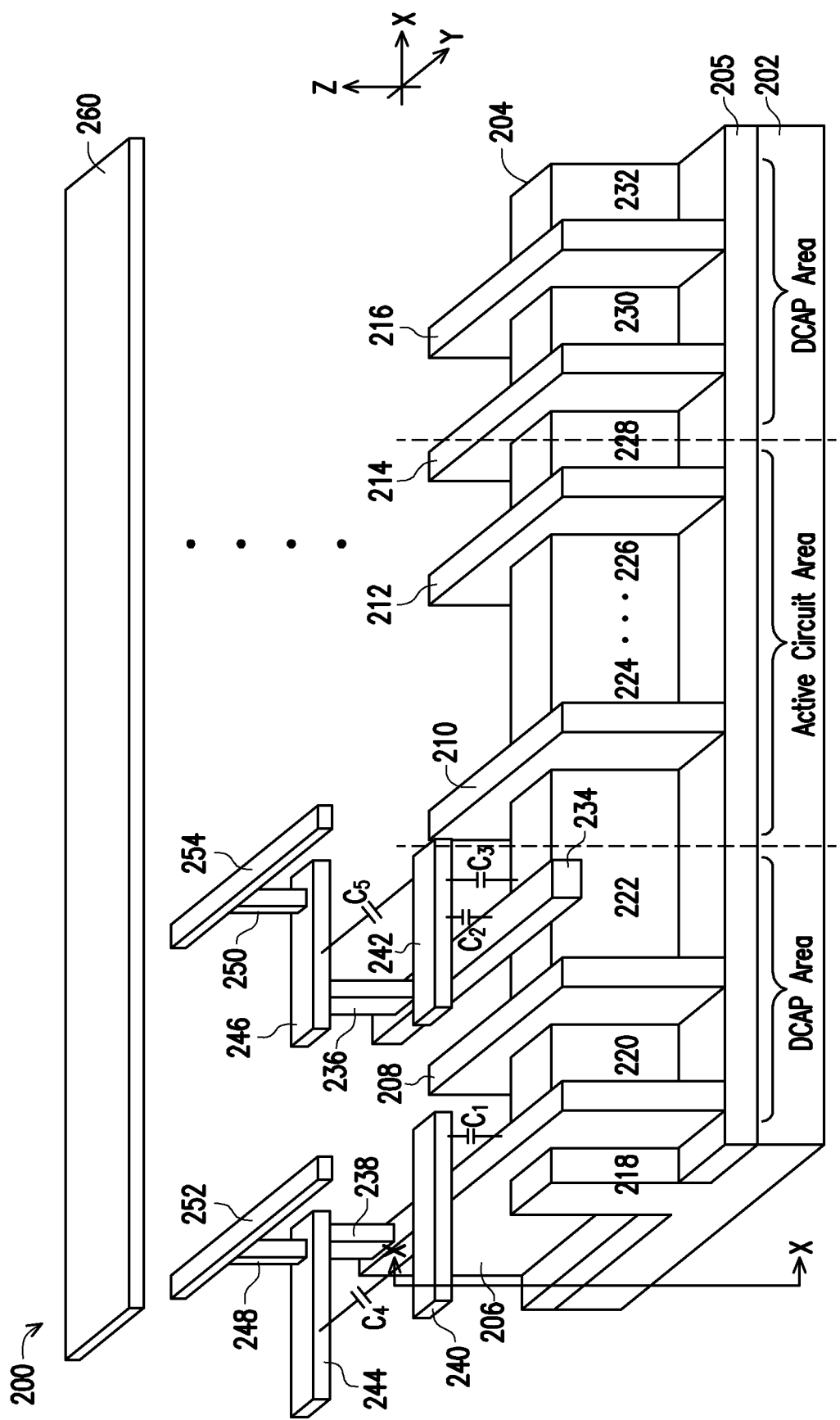
FIGS. 2A and 2B respectively illustrate a perspective and cross-sectional view of a semiconductor device made based on the layout design of FIG. 1, in accordance with some embodiments.

Referring next to FIG. 2A, illustrated in a perspective view of a semiconductor device 200 that can be fabricated based on the layout deign 100 of FIG. 1 to include a number of interlayer decoupling capacitors, in accordance with various embodiments. Correspondence between the layout design 100 and the semiconductor device 200 will be further illustrated through the following discussion. In the example of FIG. 2A, the semiconductor device 200 may include additional structures formed by patterns not shown in the layout design 100. For purposes of clarification, FIG. 2B further illustrates a cross-sectional view of a portion of the semiconductor device 200 (e.g., one of the DCAP areas), cut along cross-section X-X indicated in FIG. 2A.

Figure 2B:
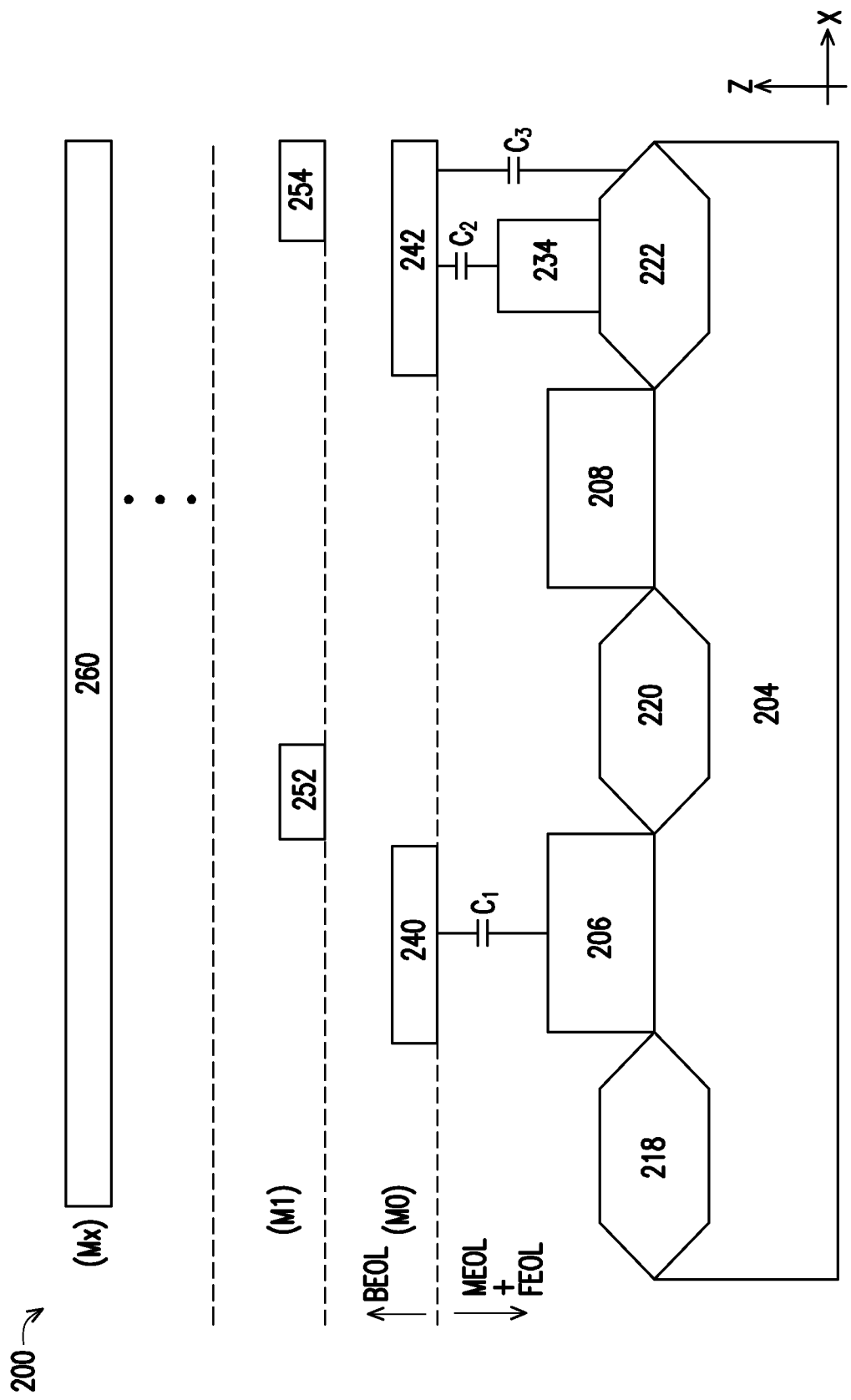

In some embodiments, the semiconductor device 200 is formed as a FinFET device in the illustrated example of FIGS. 2A-B. However, it should be appreciated that the semiconductor device 200 may be formed as any of various other non-planer transistor devices (e.g., a GAA transistor device) or a planar transistor device based on the layout design 100 of FIG. 1, while remaining within the scope of the present disclosure.

As shown, the semiconductor device 200 includes a substrate 202, and a fin structure 204 protruding from a major surface of the substrate 202. The fin structure 204 may be formed based on the active region pattern 102 of FIG. 1 to extend along the X axis. On opposite sides of the fin structure 204 (along the Y axis), a shallow trench isolation (STI) structure 205 may be formed over the major surface of the substrate 202 to embed a lower portion of the fins structure 204. The semiconductor device 200 further includes (e.g., metal) gate structures, 206, 208, 210, 212, 214, and 216, straddling a number of portions of the fin structure 204. The gate structures 206, 208, 210, 212, 214, and 216 may be formed based on the gate structure patterns 104, 106, 108, 110, 112, and 114 of FIG. 1, respectively, to each extend along the Y axis. Along the fin structure 204 next to opposite sides of each gate structure, the semiconductor device 200 further includes (e.g., epitaxially grown) source/drain structures, 218, 220, 222, 224, 226, 228, 230, and 232, which may be formed based on the portions 120, 122, 124, 126, 128, 130, 132, and 134 of FIG. 1, respectively. The gate structures 206 to 216 and source/drain structures 218 to 232 are sometimes referred to as being part of the FEOL layer, as indicated in FIG. 2B.

In some embodiments, the fin structure 204 may be formed as a continuous structure with a number of gate structures crossing thereon. As such, the semiconductor device 200 can have a number of active circuits and a number of decoupling capacitors sharing the same active region (e.g., the fin structure 204). For example in FIG. 1, the gate structures 210 to 212, together with corresponding portions of the fin structure 204 (e.g., 224, 226, etc.), may form a number of active circuits (e.g., a memory circuit, a logic circuit, an input/output circuit, etc.) in the active circuit area, while the gate structures 206 to 208 and 214 to 216, together with corresponding portions of the fin structure 204 (e.g., 218, 220, 222, 228, 230, 232, etc.), may at least in part form a number of decoupling capacitors in the DCAP area(s). Further, the gate structures to form the disclosed decoupling capacitors may be disposed closer to the edge of the fin structure 204 than the gate structures to form the active circuits, according to various embodiments. Alternatively stated, along a same active region where active circuits and decoupling capacitors are concurrently formed, the decoupling capacitors are disposed on the sides of the active region, with the active circuits sandwiched between the decoupling capacitors.

Coupled to the source/drain structure 222, the semiconductor device 200 further includes an interconnect structure (e.g., MD) 234, which may be formed based on the MD pattern 144. The MD 234 can extend along the Y axis. Coupled to the MD 234, the semiconductor device 200 further includes an interconnect structure (e.g., VD) 236, which may be formed based on the VD pattern 150. The VD 236 can extend along a vertical direction (e.g., the Z axis of FIG. 2A). Coupled to the gate structure 206, the semiconductor device 200 further includes a via interconnect structure (e.g., VG) 238, which may be formed based on the VG pattern 152. The VG 238 can extend along the Z axis. The MD 242, VD 236, and VG 238 are sometimes referred to as being part of the MEOL layer, as indicated in FIG. 2B.

Over the MEOL layer, the semiconductor device 200 further includes a number of BEOL layers (sometimes referred to as metallization layers), each of which includes a number of interconnect structures. In the illustrated embodiments of FIGS. 2A-B, the bottommost BEOL layer (sometimes referred to as an M0 layer) includes interconnect structures (e.g., M0) 240, 242, 244, and 246. The M0's 240, 242, 244, and 246 may be formed based on the M0 patterns 154, 156, 158, and 160 of FIG. 1 to extend along the X axis.

According to various embodiments of the present disclosure, the M0 240 can be vertically disposed over the gate structure 206 with an interlayer dielectric (ILD) disposed therebetween to form a first interlayer decoupling capacitor, $C_1$. The M0 240 and gate structure 206 can function as opposite electrodes (terminals or otherwise ends) of the first interlayer decoupling capacitor, $C_1$, respectively. The M0 242 can be vertically disposed over the MD 234 with an ILD disposed therebetween to form a second interlayer decoupling capacitor, $C_2$. The M0 242 and MD 234 can function as opposite electrodes (terminals or otherwise ends) of the second interlayer decoupling capacitor, $C_2$, respectively. The M0 242 can laterally extend with a certain distance to overlay a portion of the source/drain structure 222 so as to form a third interlayer decoupling capacitor, $C_3$. The M0 242 and source/drain structure 222 can function as opposite electrodes (terminals or otherwise ends) of the third interlayer decoupling capacitor, $C_3$, respectively.

A capacitance value of each of the disclosed decoupling capacitors, $C_1$ to $C_3$, may be determined based on various parameters of its electrodes and the dielectric layer interposed therebetween, in accordance with various embodiments. For example, the capacitance value of the decoupling capacitor $C_1$ may be determined based on at least one of: (i) how much in area the M0 240 and gate structure 206 overlap with each other (when viewed from the top); (ii) a vertical distance between the M0 240 and gate structure 206: or (iii) a dielectric constant of the ILD interposed between the M0 240 and gate structure 206. In another example, the capacitance value of the decoupling capacitor Ca may be determined based on at least one of: (i) how much in area the M0 242 and MD 234 overlap with each other (when viewed from the top); (ii) a vertical distance between the M0 242 and MD 234: or (iii) a dielectric constant of the ILD interposed between the M0 242 and MD 234. In yet another example, capacitance value of the decoupling capacitor $C_3$ may be determined based on at least one of: (i) how much in area the M0 242 and the portion of the source/drain structure 222 overlap with each other (when viewed from the top); (ii) a vertical distance between the M0 242 and the source/drain structure 222: or (iii) a dielectric constant of the ILD interposed between the M0 242 and the source/drain structure 222.

Although not shown, the semiconductor device 200 may include one or more other interlayer decoupling capacitors formed by a region of the substrate 202 that is not overlaid by the STI structure 205 and one of the M0's. Alternatively stated, the region of the substrate 202 and the M0 can function as opposite electrodes (terminals or otherwise ends) of this type of interlayer decoupling capacitors, respectively. Such a region can have a conduction type, for example, a p-type doped region or an n-type doped region.

Further, the M0 244 can be laterally disposed next to the M0 240 with an intralayer metal dielectric (IMD) disposed therebetween to form a first intralayer decoupling capacitor, $C_4$. The M0's 240 and 244 can function as opposite electrodes (terminals or otherwise ends) of the first intralayer decoupling capacitor, $C_4$, respectively. The M0 246 can be laterally disposed next to the M0 242 with an IMD disposed therebetween to form a second intralayer decoupling capacitor, $C_5$. The M0's 242 and 246 can function as opposite electrodes (terminals or otherwise ends) of the second intralayer decoupling capacitor, $C_5$, respectively.

Over the M0 layer, the semiconductor device 200 further includes a number of BEOL layers, for example, an M1 layer and up to the topmost MX layer, as shown in FIG. 2B. In the M1 layer, the semiconductor device 200 further includes a number of interconnect structures (e.g., M1) 252 and 254, extending along the Y axis. In the illustrated example of FIG. 2A, the M1 252 is electrically coupled to the M0 244 through a via interconnect structure 248, and the M1 254 is electrically coupled to the M0 246 through a via interconnect structure 250. Over the M1 layer, the semiconductor device 200 further includes a number of BEOL layers. Each of such BEOL layers can include a number of interconnect structures, extending either along the X axis or the Y axis, to electrically couple the lower-level interconnect structures to the higher-level interconnect structures. For example, the semiconductor device 200 can include a number of interconnect structures (not shown) between the M1 layer and the topmost MX layer to electrically couple the M1's 252 and 254 to a power rail 260 in the topmost MX layer. The power rail 260 can provide a power supply voltage, e.g., VDD, VSS.

According to various embodiments of the present disclosure, each of the interlayer decoupling capacitors ($C_1$, $C_2$, $C_3$) and intralayer decoupling capacitors ($C_4$, $C_5$) has one electrode electrically tied to either VDD or VSS, and the other electrode connected to a decoupling node, which may be the input of a circuit formed by the transistors in the active circuit area. As such, each of the interlayer/intralayer decoupling capacitors can help smooth out any unexpected changes in an input voltage (to the corresponding circuit) from a power supply.

For example, the interlayer decoupling capacitor $C_1$ has one of its electrodes (e.g., the gate structure 206) coupled to the power rail 260 carrying VDD or VSS through the VG 238, the M0 244 and a number of interconnect structures therebetween (e.g., 248, 252, etc.), and the other one of its electrodes (e.g., the M0 240) connected to a circuit (not shown) in the active circuit area. The interlayer decoupling capacitor $C_2$ has one of its electrodes (e.g., the MD 234) coupled to the power rail 260 carrying VDD or VSS through the VD 236, the M0 246 and a number of interconnect structures therebetween (e.g., 250, 254, etc.), and the other one of its electrodes (e.g., the M0 242) connected to a circuit (not shown) in the active circuit area. The interlayer decoupling capacitor $C_3$ has one of its electrodes (e.g., the source/drain structure 222) coupled to the power rail 260 carrying VDD or VSS through the MD 234, the VD 236, the M0 246 and a number of interconnect structures therebetween (e.g., 250, 254, etc.), and the other one of its electrodes (e.g., the M0 242) connected to a circuit (not shown) in the active circuit area. The intralayer decoupling capacitor $C_4$ has one of its electrodes (e.g., the M0 244) coupled to the power rail 260 carrying VDD or VSS through a number of interconnect structures therebetween (e.g., 248, 252, etc.), and the other one of its electrodes (e.g., the M0 240) connected to a circuit (not shown) in the active circuit area. The intralayer decoupling capacitor $C_5$ has one of its electrodes (e.g., the M0 246) coupled to the power rail 260 carrying VDD or VSS through a number of interconnect structures therebetween (e.g., 250, 254, etc.), and the other one of its electrodes (e.g., the M0 242) connected to a circuit (not shown) in the active circuit area.

Figure 3:
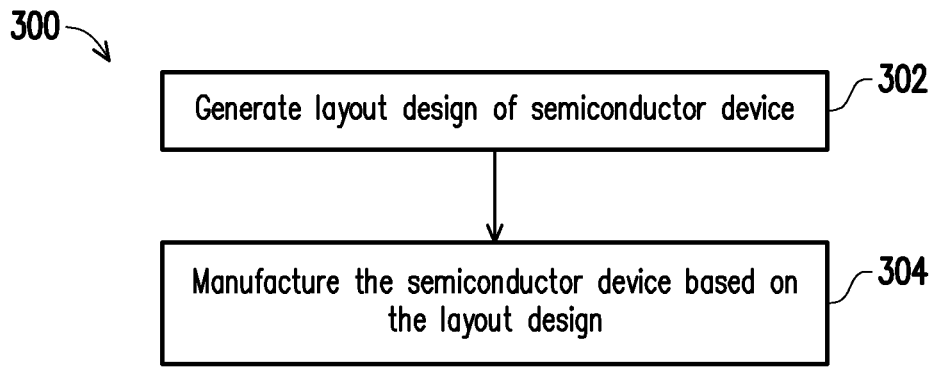
FIG. 3 illustrates a flowchart of a method of manufacturing a semiconductor device, in accordance with some embodiments.

FIG. 3 is a flowchart of a method 300 of forming or manufacturing a semiconductor device, in accordance with some embodiments. It is understood that additional operations may be performed before, during, and/or after the method 300 depicted in FIG. 3. In some embodiments, the method 300 is usable to form a semiconductor device, according to various layout designs as disclosed herein.

In operation 310 of the method 300, a layout design of a semiconductor device (e.g., the layout design 100 of FIG. 1) is generated. The operation 310 is performed by a processing device (e.g., processor 402 of FIG. 4) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system II (GDSII) file format.

In operation 320 of the method 300, a semiconductor device is manufactured based on the layout design. In some embodiments, the operation 320 of the method 300 includes manufacturing at least one mask based on the layout design, and manufacturing the a semiconductor device based on the at least one mask. A number of example manufacturing operations of the operation 320 will be discussed with respect to the method 600 of FIG. 6 below.

Figure 4:
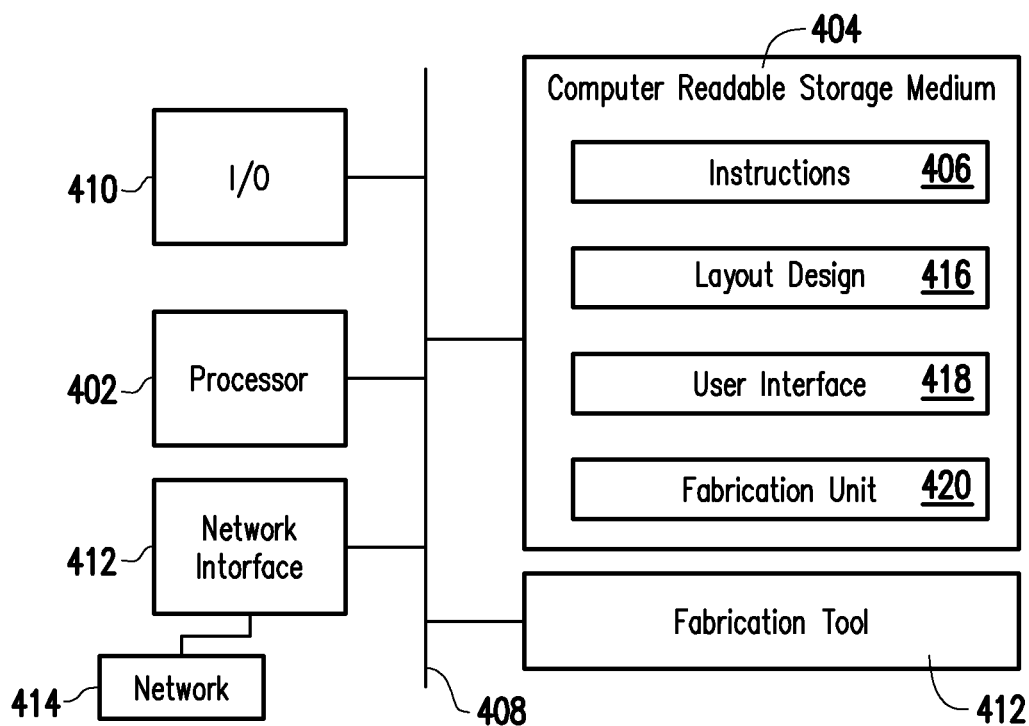
FIG. 4 illustrates a block diagram of a system of generating an IC layout design, in accordance with some embodiments.

FIG. 4 is a schematic view of a system 400 for designing and manufacturing an IC layout design, in accordance with some embodiments. The system 400 generates or places one or more IC layout designs, as described herein. In some embodiments, the system 400 manufactures one or more semiconductor devices based on the one or more IC layout designs, as described herein. The system 400 includes a hardware processor 402 and a non-transitory, computer readable storage medium 404 encoded with, e.g., storing, the computer program code 406, e.g., a set of executable instructions. The computer readable storage medium 404 is configured for interfacing with manufacturing machines for producing the semiconductor device. The processor 402 is electrically coupled to the computer readable storage medium 404 by a bus 408. The processor 402 is also electrically coupled to an I/O interface 410 by the bus 408. A network interface 412 is also electrically connected to the processor 402 by the bus 408. Network interface 412 is connected to a network 414, so that the processor 402 and the computer readable storage medium 404 are capable of connecting to external elements via network 414. The processor 402 is configured to execute the computer program code 406 encoded in the computer readable storage medium 404 in order to cause the system 400 to be usable for performing a portion or all of the operations as described in method 300.

In some embodiments, the processor 402 is a central processing unit (CPU), a multi-processor, a distributed processing system, an application specific integrated circuit (ASIC), and/or a suitable processing unit.

In some embodiments, the computer readable storage medium 404 is an electronic, magnetic, optical, electromagnetic, infrared, and/or a semiconductor system (or apparatus or device). For example, the computer readable storage medium 404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 404 includes a compact disk-read only memory (CD-ROM), a compact disk-read/write (CD-R/W), and/or a digital video disc (DVD).

In some embodiments, the storage medium 404 stores the computer program code 406 configured to cause the system 400 to perform the method 300. In some embodiments, the storage medium 404 also stores information needed for performing method 300 as well as information generated during performance of method 300, such as layout design 416, user interface 418, fabrication unit 420, and/or a set of executable instructions to perform the operation of method 300.

In some embodiments, the storage medium 404 stores instructions (e.g., the computer program code 406) for interfacing with manufacturing machines. The instructions (e.g., the computer program code 406) enable the processor 402 to generate manufacturing instructions readable by the manufacturing machines to effectively implement the method 300 during a manufacturing process.

The system 400 includes the I/O interface 410. The I/O interface 410 is coupled to external circuitry. In some embodiments, the I/O interface 410 includes a keyboard, keypad, mouse, trackball, trackpad, and/or cursor direction keys for communicating information and commands to the processor 402.

The system 400 also includes the network interface 412 coupled to the processor 402. The network interface 412 allows the system 400 to communicate with the network 414, to which one or more other computer systems are connected. The network interface 412 includes wireless network interfaces such as BLUETOOTH, WIFI, WIMAX, GPRS, or WCDMA; or wired network interface such as ETHERNET, USB, or IEEE-13154. In some embodiments, the method 300 is implemented in two or more systems 400, and information such as layout design, user interface and fabrication unit are exchanged between different systems 400 by the network 414.

The system 400 is configured to receive information related to a layout design through the I/O interface 410 or network interface 412. The information is transferred to the processor 402 by the bus 408 to determine a layout design for producing an IC. The layout design is then stored in the computer readable medium 404 as the layout design 416. The system 400 is configured to receive information related to a user interface through the I/O interface 410 or network interface 412. The information is stored in the computer readable medium 404 as the user interface 418. The system 400 is configured to receive information related to a fabrication unit through the I/O interface 410 or network interface 412. The information is stored in the computer readable medium 404 as the fabrication unit 420. In some embodiments, the fabrication unit 420 includes fabrication information utilized by the system 400.

In some embodiments, the method 300 is implemented as a standalone software application for execution by a processor. In some embodiments, the method 300 is implemented as a software application that is a part of an additional software application. In some embodiments, the method 300 is implemented as a plug-in to a software application. In some embodiments, the method 300 is implemented as a software application that is a portion of an EDA tool. In some embodiments, the method 300 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the method 300 is implemented by a manufacturing device to manufacture an integrated circuit using a set of masks manufactured based on one or more layout designs generated by the system 400. In some embodiments, the system 400 includes a manufacturing device (e.g., fabrication tool 422) to manufacture an integrated circuit using a set of masks manufactured based on one or more layout designs of the present disclosure. In some embodiments, the system 400 of FIG. 4 generates layout designs of an IC that are smaller than other approaches. In some embodiments, the system 400 of FIG. 4 generates layout designs of a semiconductor device that occupy less area than other approaches.

Figure 5:
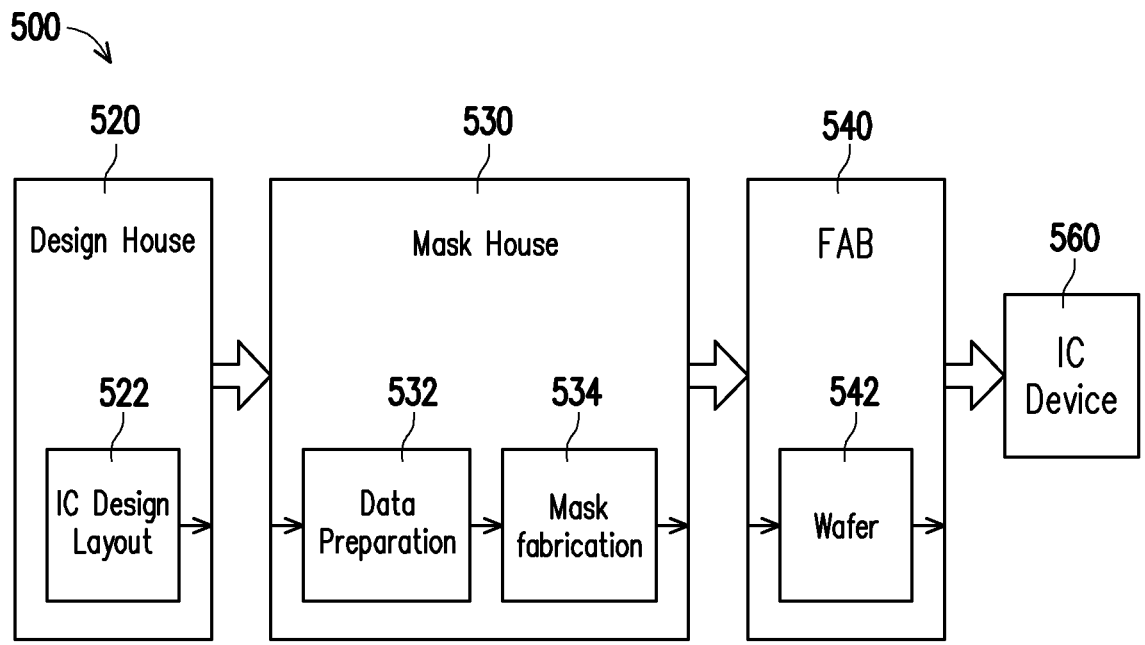
FIG. 5 illustrates a block diagram of an IC manufacturing system, and an IC manufacturing flow associated therewith, in accordance with some embodiments.

FIG. 5 is a block diagram of an integrated circuit (IC)/semiconductor device manufacturing system 500, and an IC manufacturing flow associated therewith, in accordance with at least one embodiment of the present disclosure.

In FIG. 5, the IC manufacturing system 500 includes entities, such as a design house 520, a mask house 530, and an IC manufacturer/fabricator ("fab") 540, that interact with one another in the design, development, and manufacturing cycles and/or services related to manufacturing an IC device (semiconductor device) 560. The entities in system 500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 520, mask house 530, and IC fab 540 is owned by a single company. In some embodiments, two or more of design house 520, mask house 530, and IC fab 540 coexist in a common facility and use common resources.

The design house (or design team) 520 generates an IC design layout 522. The IC design layout 522 includes various geometrical patterns designed for the IC device 560. The geometrical patterns correspond to patterns of metal, oxide, or semiconductor layers that make up the various components of the IC device 560 to be fabricated. The various layers combine to form various IC features. For example, a portion of the IC design layout 522 includes various IC features, such as an active region (e.g., 204 of FIG. 2), gate structures (e.g., 206-216 of FIG. 2), source/drain structures (e.g., 218-232 of FIG. 2), interconnect structures (e.g., 234-254 of FIG. 2), and openings for bonding pads, to be formed in a semiconductor substrate (such as a silicon wafer) and various material layers disposed on the semiconductor substrate. The design house 520 implements a proper design procedure to form the IC design layout 522. The design procedure includes one or more of logic design, physical design or place and route. The IC design layout 522 is presented in one or more data files having information of the geometrical patterns. For example, the IC design layout 522 can be expressed in a GDSII file format or DFII file format.

The mask house 530 includes mask data preparation 532 and mask fabrication 534. The mask house 530 uses the IC design layout 522 to manufacture one or more masks to be used for fabricating the various layers of the IC device 560 according to the IC design layout 522. The mask house 530 performs the mask data preparation 532, where the IC design layout 522 is translated into a representative data file ("RDF"). The mask data preparation 532 provides the RDF to the mask fabrication 534. The mask fabrication 534 includes a mask writer. A mask writer converts the RDF to an image on a substrate, such as a mask (reticle) or a semiconductor wafer. The design layout is manipulated by the mask data preparation 532 to comply with particular characteristics of the mask writer and/or requirements of the IC fab 540. In FIG. 5, the mask data preparation 532 and mask fabrication 534 are illustrated as separate elements. In some embodiments, the mask data preparation 532 and mask fabrication 534 can be collectively referred to as mask data preparation.

In some embodiments, the mask data preparation 532 includes optical proximity correction (OPC) which uses lithography enhancement techniques to compensate for image errors, such as those that can arise from diffraction, interference, other process effects and the like. OPC adjusts the IC design layout 522. In some embodiments, the mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 532 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 534, which may undo part of the modifications performed by OPC in order to meet mask creation rules.

In some embodiments, the mask data preparation 532 includes lithography process checking (LPC) that simulates processing that will be implemented by the IC fab 540 to fabricate the IC device 560. LPC simulates this processing based on the IC design layout 522 to create a simulated manufactured device, such as the IC device 560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 522.

It should be understood that the above description of the mask data preparation 532 has been simplified for the purposes of clarity. In some embodiments, the mask data preparation 532 includes additional features such as a logic operation (LOP) to modify the IC design layout according to manufacturing rules. Additionally, the processes applied to the IC design layout 522 during the mask data preparation 532 may be executed in a variety of different orders.

After the mask data preparation 532 and during mask fabrication 534, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 534 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 540 is an IC fabrication entity that includes one or more manufacturing facilities for the fabrication of a variety of different IC products. In some embodiments, the IC fab 540 is a semiconductor foundry. For example, there may be a first manufacturing facility for the front end fabrication of a plurality of IC products (e.g., a front-end-of-line (FEOL) layer), while a second manufacturing facility may provide the middle end fabrication for the interconnection of the IC products (e.g., a middle-end-of-line (MEOL) layer) and a third manufacturing facility may provide the back end fabrication for the interconnection and packaging of the IC products (e.g., a back-end-of-line (BEOL) layer), and a fourth manufacturing facility may provide other services for the foundry entity.

The IC fab 540 uses the mask (or masks) fabricated by the mask house 530 to fabricate the IC device 560. Thus, the IC fab 540 at least indirectly uses the IC design layout 522 to fabricate the IC device 560. In some embodiments, a semiconductor wafer 542 is fabricated by the IC fab 540 using the mask (or masks) to form the IC device 560. The semiconductor wafer 542 includes a silicon substrate or other proper substrate having material layers formed thereon. Semiconductor wafer further includes one or more of various doped regions, dielectric features, multilevel interconnects, and the like (formed at subsequent manufacturing steps).

The system 500 is shown as having the design house 520, mask house 530, and IC fab 540 as separate components or entities. However, it should be understood that one or more of the design house 520, mask house 530 or IC fab 540 are part of the same component or entity.

Figure 6:
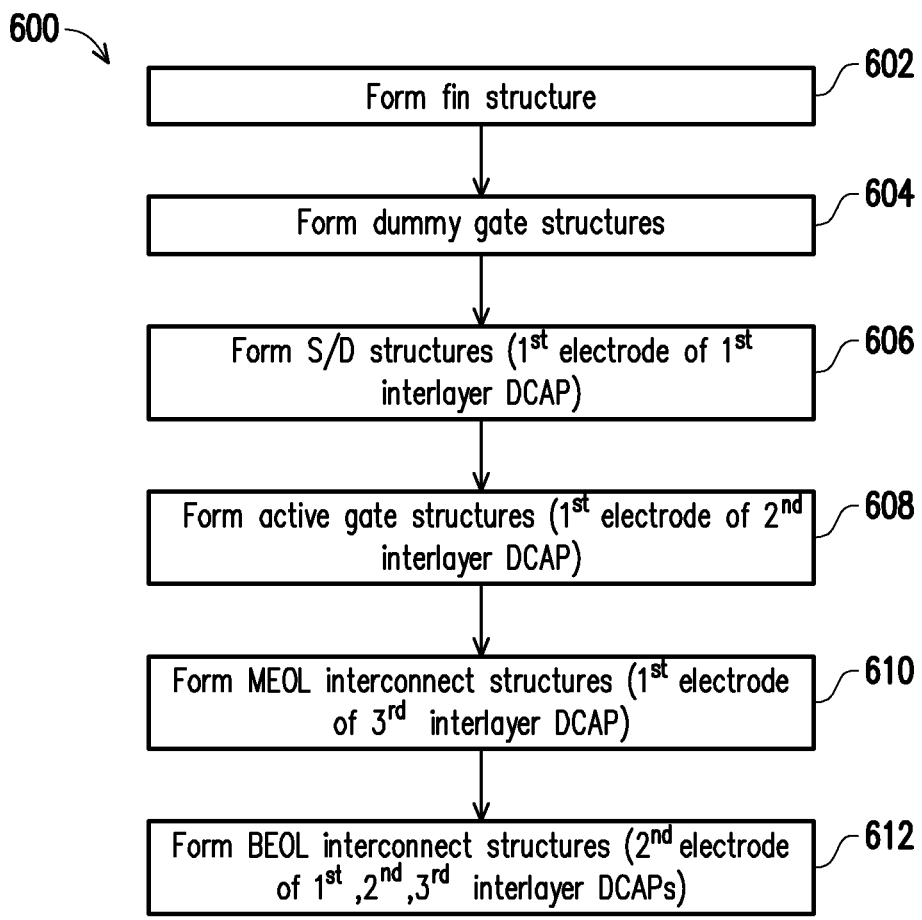
FIG. 6 illustrates a flow chart of an example method for making a semiconductor device that includes a number of interlayer decoupling capacitors, in accordance with some embodiments.

FIG. 6 is a flowchart illustrating an example method 600 for fabricating a semiconductor device 700 that includes the disclosed interlayer decoupling capacitors, according to various aspects of the present disclosure. The method 600 may be part of the operation 320 of the method 300 (FIG. 3). As such, the semiconductor device 700 may be made based on at least a portion of the layout design disclosed herein. For example, the layout design 100 of FIG. 1 may be used to make the semiconductor device 700. Thus, the semiconductor device 200 of FIGS. 2A-B (made out of the layout design 100) may share some substantially similar features/structures as the semiconductor device 700.

FIGS. 7, 8, 9, 10, 11, and 12 show schematic cross-sectional views of the semiconductor device 700 at various stages of fabrication, according to an embodiment of the method 600 of FIG. 6. Thus, each of the operations of the method 600 shall be discussed in conjunction with a corresponding one of the cross-sectional views of the semiconductor device 700 shown in FIGS. 7-12.

The semiconductor device 700 may include a microprocessor, memory cell, and/or other integrated circuits (ICs). It is noted that the method of FIG. 6 does not produce a completed semiconductor device 700. A completed semiconductor device 700 may be fabricated using complementary metal-oxide-semiconductor (CMOS) technology processing. Accordingly, it is understood that additional operations may be provided before, during, and after the method 600 of FIG. 6, and that some other operations may only be briefly described herein. Also, FIGS. 7 through 12 are simplified for a better understanding of the present disclosure. For example, although the figures illustrate the semiconductor device 700, it is understood the semiconductor device 700 may include a number of other devices comprising transistors, resistors, capacitors, inductors, fuses, etc.

Figure 7:
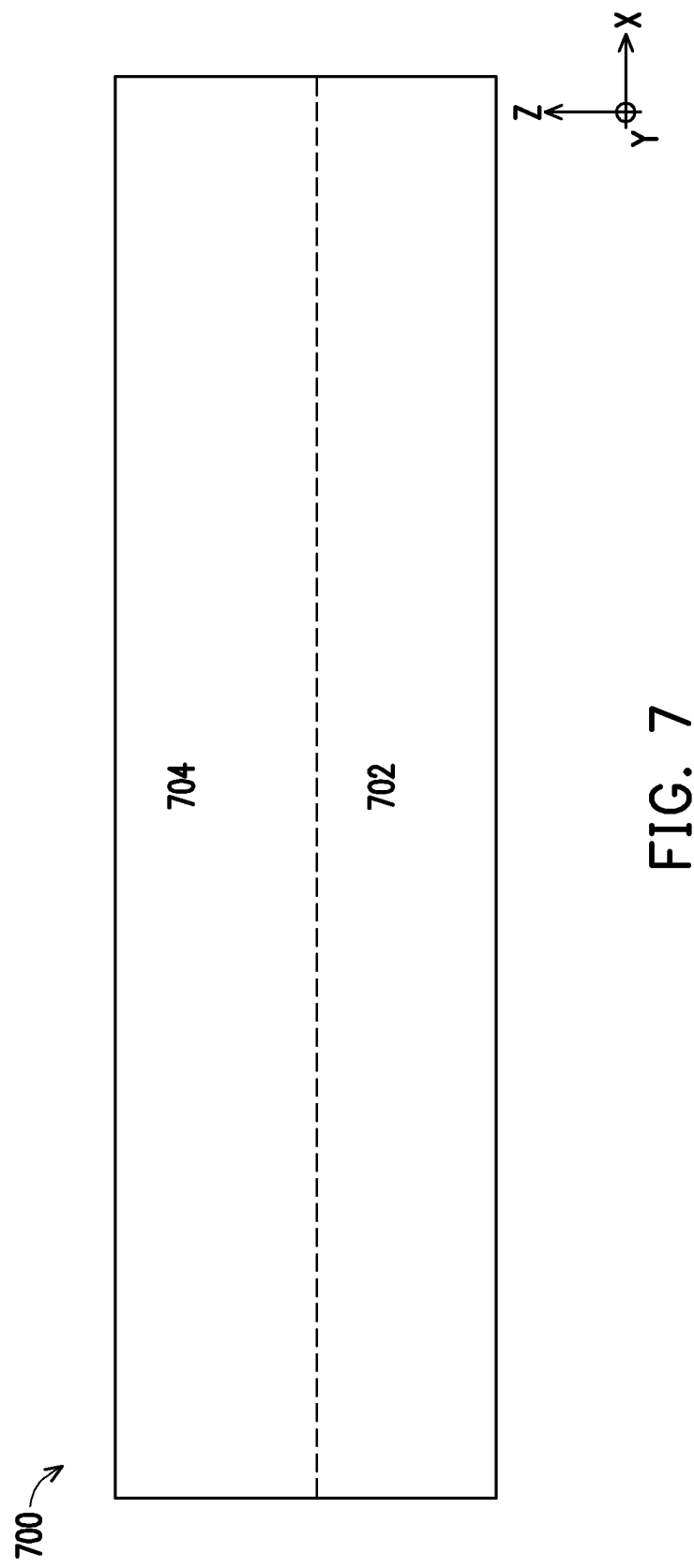
FIGS. 7, 8, 9, 10, 11, and 12 illustrate cross-sectional views of an example semiconductor device (or a portion of the example semiconductor device) during various fabrication stages, made by the method of FIG. 6, in accordance with some embodiments.

Referring to FIGS. 6 and 7, the method 600 begins at operation 602 in which at least an active region 704 is formed over a substrate 702, in accordance with some embodiments. The cross-sectional view of semiconductor device 700 shown in FIG. 7 may be cut along a lengthwise direction of the active region 704 (e.g., the X axis indicated in FIG. 2A).

The substrate 702 may be a semiconductor substrate, such as a bulk semiconductor, a semiconductor-on-insulator (SOI) substrate, or the like, which may be doped (e.g., with a p-type or an n-type dopant) or undoped. The substrate 702 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 702 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the active region 704 is formed as a fin structure (hereinafter "fin 704") that extends along the X axis, i.e., having a lengthwise direction along the X axis. Although in the illustrated example of FIG. 7, the fin 704 is shown as a portion protruding from a major surface (indicated by dotted line) of the substrate 702. While remaining within the scope of the present disclosure, however, it should be understood that the active region 704 can be formed as a stack structure that also protrudes from the major surface of the substrate 702, but includes a number of first semiconductor layers (functioning as channel layers) and a number of second semiconductor layers (function as sacrificial layers) alternatively stacked on top of one another.

Although one fin is shown in the illustrated embodiment of FIG. 7 (and the following figures), it should be appreciated that the semiconductor device 700 can include any number of fins while remaining within the scope of the present disclosure. In some embodiments, the fin 704 is formed by patterning the substrate 702 using, for example, photolithography and etching techniques. For example, a mask layer, such as a pad oxide layer and an overlying pad nitride layer, is formed over the substrate 702. The pad oxide layer may be a thin film comprising silicon oxide formed, for example, using a thermal oxidation process. The pad oxide layer may act as an adhesion layer between the substrate 702 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask is subsequently used to pattern exposed portions of the substrate 702 to form trenches (or openings), thereby defining a fin structure (e.g., 704) between adjacent trenches. When multiple fin structures are formed, such a trench may be disposed between any adjacent ones of the fin structures. In some embodiments, the fin 704 is formed by etching trenches in the substrate 702 using, for example, reactive ion etch (RIE), neutral beam etch (NBE), the like, or combinations thereof. The etch may be anisotropic. In some embodiments, the trenches may be strips (viewed from the top) parallel to each other, and closely spaced with respect to each other. In some embodiments, the trenches may be continuous and surround each of the fins.

The fin 704 may be patterned by any suitable method. For example, the fin 704 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 8:
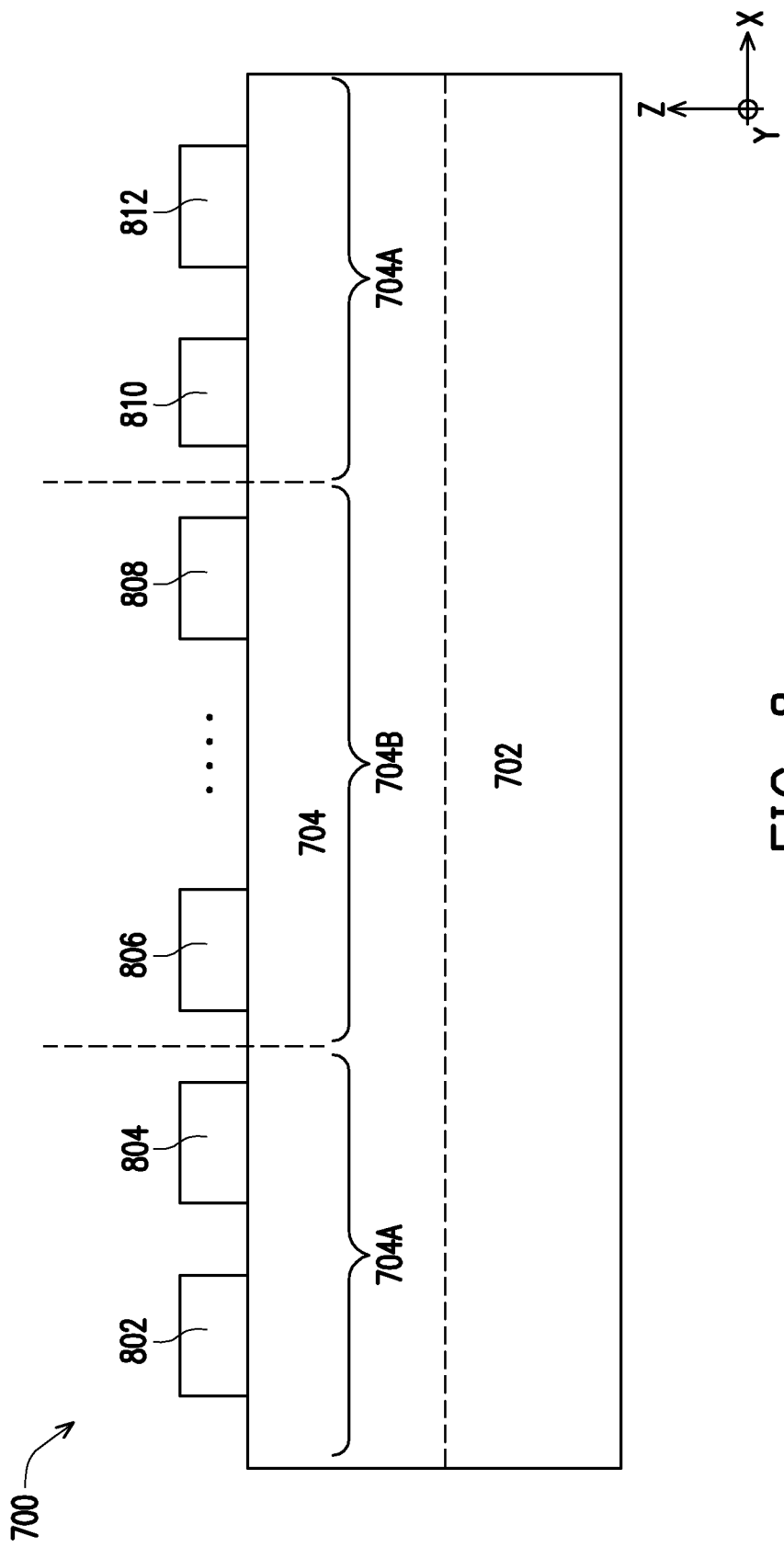

Referring to FIGS. 6 and 8, the method 600 proceeds to operation 604 in which a number of dummy gate structures 802, 804, 806, 808, 810, and 812 are formed, in accordance with some embodiments. The cross-sectional view of semiconductor device 700 shown in FIG. 8 may be cut along a lengthwise direction of the active region 704 (e.g., the X axis indicated in FIG. 2A).

The dummy gate structures 802 to 812 are each formed to straddle a respective portion of the fins 704. For example, each of the dummy gate structures 802 to 812 may extend along a direction perpendicular to the lengthwise direction of the fin 704 (e.g., the Y axis indicated in FIG. 2A). Further, some of the dummy gate structures (e.g., 802-804, 810-812) are disposed in an area closer to the edge of the fin 704 (e.g., 704A) than an area farther from the edge of the fin 704 (e.g., 704B) where other dummy gate structures (e.g., 806-808) are disposed.

The dummy gate structures 802 to 812 can each include a dummy gate dielectric and a dummy gate, in some embodiments. To form the dummy gate structures 802 to 812, a dielectric layer is formed on the fin 704. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. A mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques. The pattern of the mask layer may then be transferred to the gate layer and the dielectric layer by an acceptable etching technique to form the dummy gate and the underlying dummy gate dielectric of each of the dummy gate structures 802 to 812. The dummy gate and the dummy gate dielectric collectively cover a portion (e.g., a channel region) of the fin 704.

Figure 9:
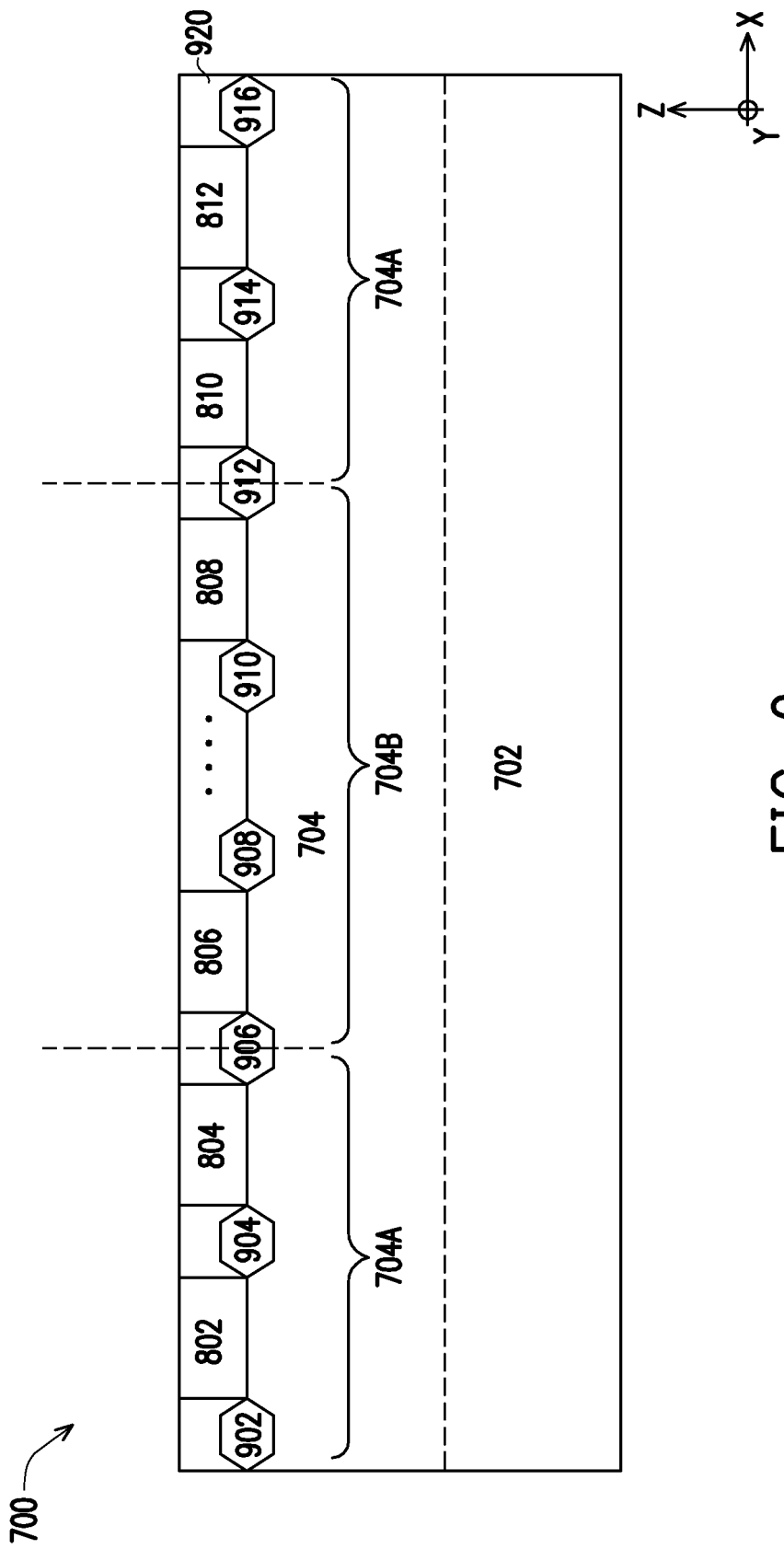

Referring to FIGS. 6 and 9, the method 600 proceeds to operation 606 in which a number of source/drain structures 902, 904, 906, 908, 910, 912, 914, and 916 are formed, in accordance with some embodiments. The cross-sectional view of semiconductor device 700 shown in FIG. 9 may be cut along a lengthwise direction of the active region 704 (e.g., the X axis indicated in FIG. 2A).

Upon forming the dummy gate structures 802 to 812, gate spacers (not shown) may be formed on opposite sides (along the X axis) of each of the dummy gate structures 802 to 812. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer.

The source/drain structures 902, 904, 906, 908, 910, 912, 914, and 916 are formed in recesses of the semiconductor fin structure 704 next to the dummy gate structures, e.g., between adjacent dummy gate structures (e.g., between the dummy gate structures 804 and 806) and/or next to a dummy gate structure (e.g., next to the dummy gate structure 802). The recesses are formed by, e.g., an anisotropic etching process using the dummy gate structures and corresponding gate spacers as an etching mask, in some embodiments, although any other suitable etching process may also be used.

The source/drain structures 902 to 916 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

The epitaxial source/drain structures 902 to 916 may have surfaces raised from respective surfaces of the semiconductor fin 704 (e.g. raised above the non-recessed portions of the semiconductor fin 704) and may have facets. In some embodiments, when the resulting transistor is an n-type transistor, the source/drain structures 902 to 916 can include silicon carbide (SiC), silicon phosphorous (SiP), phosphorous-doped silicon carbon (SiCP), or the like. In some embodiments, when the resulting transistor is a p-type transistor, the source/drain structures 902 to 916 can include SiGe, and a p-type impurity such as boron or indium.

The epitaxial source/drain structures 902 to 916 may be implanted with dopants, followed by an annealing process. The implanting process may include forming and patterning masks such as a photoresist to cover the regions of the workpiece that are to be protected from the implanting process. The source/drain structures 902 to 916 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 1200 of a P-type transistor. N-type impurities, such as phosphorous or arsenide, may be implanted in the source/drain structures 902 to 916 of an N-type transistor. In some embodiments, the epitaxial source/drain structures 902 to 916 may be in situ doped during their growth.

Upon forming the source/drain structures 902 to 916, an interlayer dielectric (ILD) 920 is formed over the source/drain structures 902 to 916. The ILD 920 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 920 is formed, an optional dielectric layer can be formed over the ILD 920. The dielectric layer can function as a protection layer to prevent or reduces the loss of the ILD 920 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer. After the planarization process, the upper surface of the dielectric layer (if any) or the upper surface of the ILD 920 is level with the upper surface of the dummy gate structures 802 to 812, in some embodiments.

In some embodiments, some of the source/drain structures formed in the area 704A may each function as one of the electrodes of a first type of interlayer decoupling capacitor. A portion of the ILD 920 disposed over such a source/drain structure can function as a portion of a dielectric medium of this type of interlayer decoupling capacitor. Details of such interlayer decoupling capacitors will be discussed below.

Figure 10:
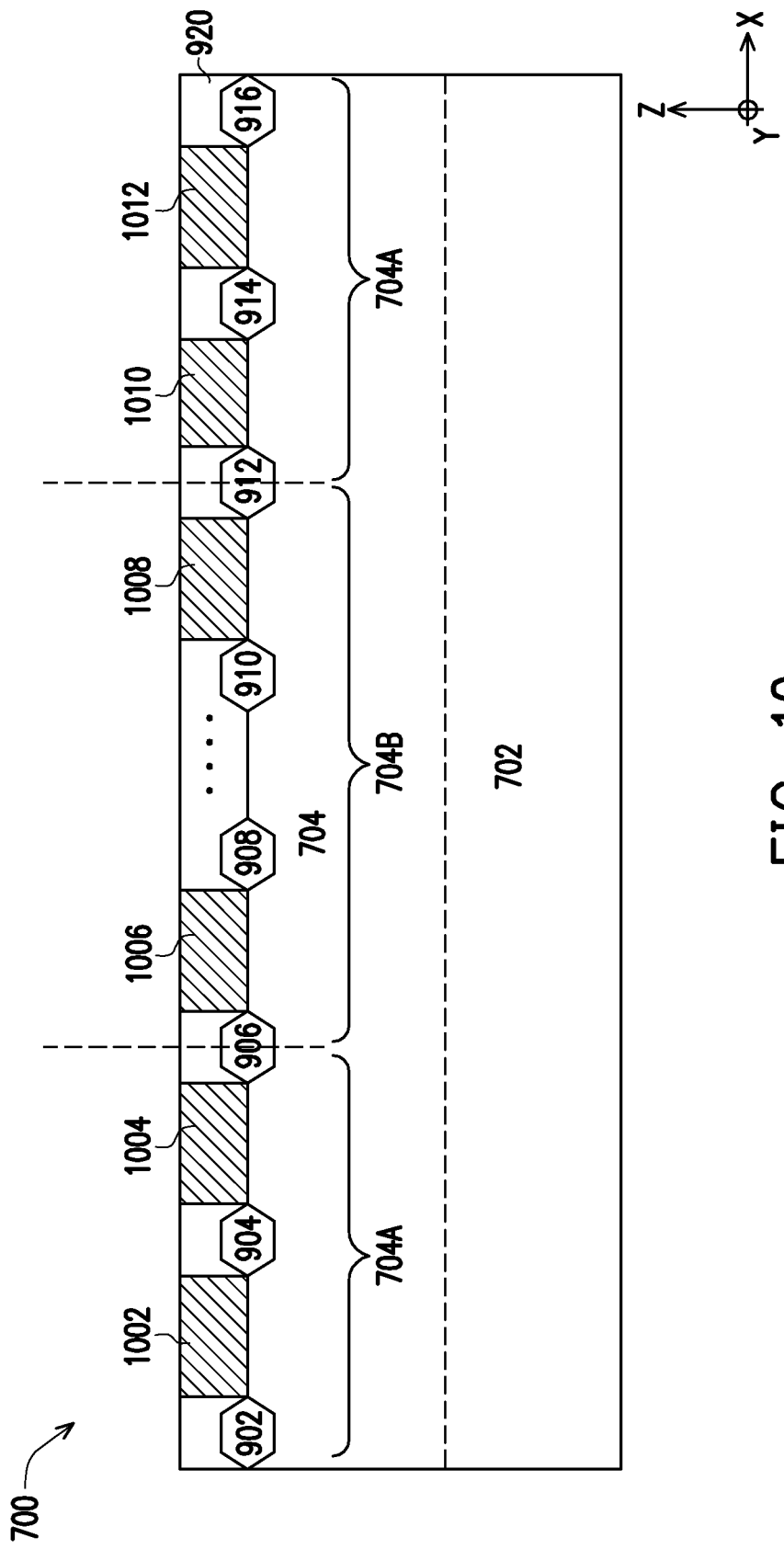

Referring to FIGS. 6 and 10, the method 600 proceeds to operation 608 in which a number of active (e.g., metal) gate structures 1002, 1004, 1006, 1008, 1010, and 1012 are formed, in accordance with some embodiments. The cross-sectional view of semiconductor device 700 shown in FIG. 10 may be cut along a lengthwise direction of the active region 704 (e.g., the X axis indicated in FIG. 2A).

The active gate structures 1002 to 1012 may be formed by replacing the dummy gate structures 802 to 812, respectively. The active gate structures 1002 to 1012 can each include a gate dielectric layer, a metal gate layer, and one or more other layers that are not shown for clarity. For example, each of the active gate structures 1002 to 1012 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer can include silicon oxide, silicon nitride, or multilayers thereof. In example embodiments, the gate dielectric layer can include a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of the gate dielectric layer may include molecular beam deposition (MBD), atomic layer deposition (ALD), PECVD, and the like. A thickness of each of the gate dielectric layer may be between about 8 angstroms (Å) and about 20 Å, as an example.

The metal gate layer can include a P-type work function layer, an N-type work function layer, multi-layers thereof, or combinations thereof, in some embodiments. Accordingly, the metal gate layer may be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In some embodiments, some of the active gate structures formed in the area 704A may each function as one of the electrodes of a second type of interlayer decoupling capacitor. A portion of another ILD disposed over such an active gate structure (which will be discussed below) can function as a dielectric medium of this type of interlayer decoupling capacitor. Details of such interlayer decoupling capacitors will be discussed below.

Figure 11:
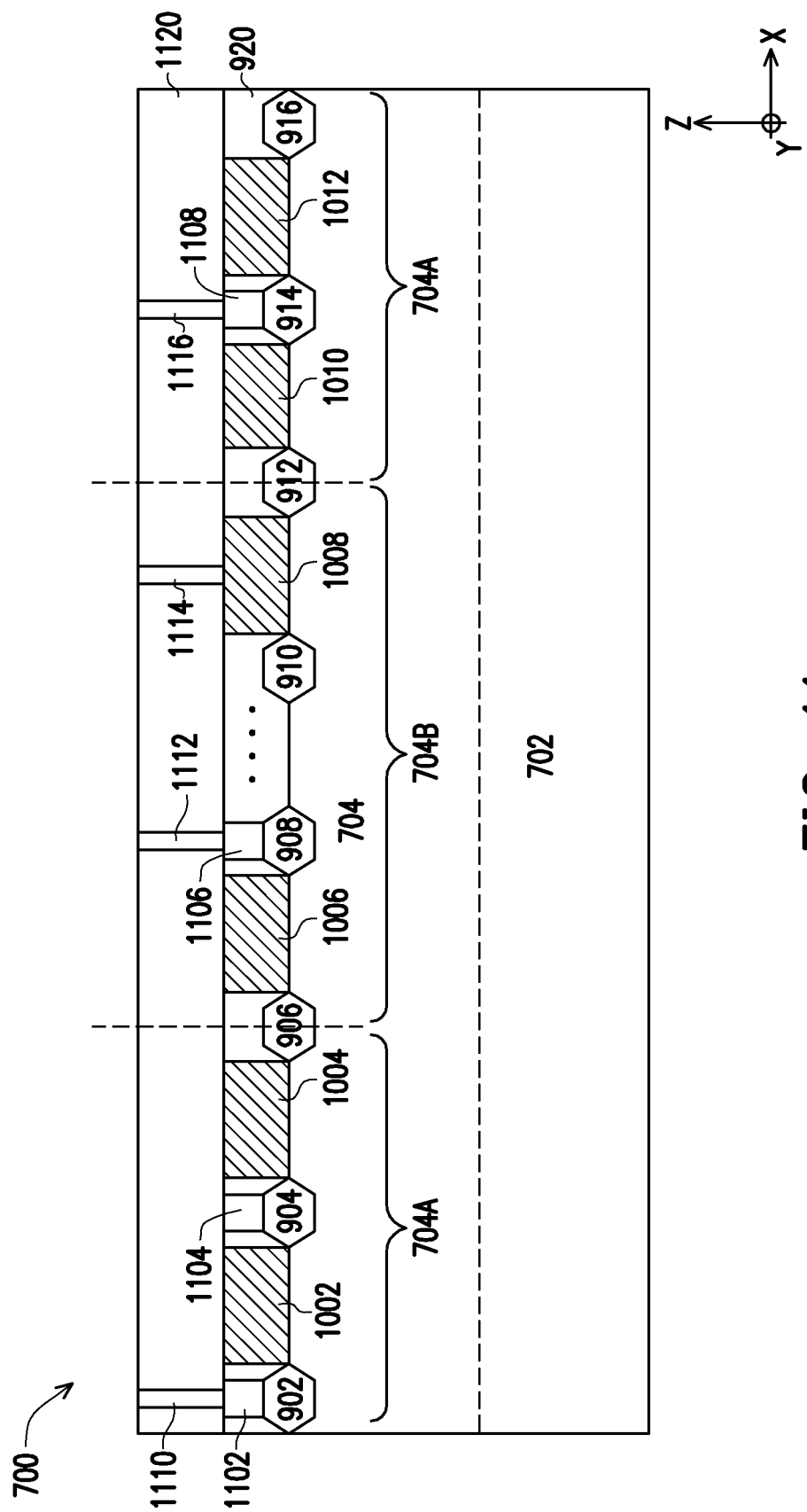

Referring to FIGS. 6 and 11, the method 600 proceeds to operation 610 in which a number of MEOL interconnect structures 1102, 1104, 1106, 1108, 1110, 1112, 1114, and 1116 are formed, in accordance with some embodiments. The cross-sectional view of semiconductor device 700 shown in FIG. 11 may be cut along a lengthwise direction of the active region 704 (e.g., the X axis indicated in FIG. 2A).

The interconnect structures 1102-1116, formed of one or more metal materials (e.g., tungsten (W), copper (Cu), gold (Au), cobalt (Co), Ruthenium (Ru), or combinations thereof), is formed to electrically couple to one or more of the FEOL features (e.g., metal gate structures, source/drain structures). For example, the interconnect structures 1102, 1104, 1106, and 1108 can electrically couple to the source/drain structures 902, 904, 908, and 914, respectively, which are sometimes referred to as MD's 1102, 1104, 1106, and 1108. Each of the MD's 1102 to 1108 can extend through the ILD 920 to be in contact with the corresponding source/drain structure. Although not shown in the cross-sectional view of FIG. 11, it should be appreciated that the MD's 1102 to 1108 generally extend along a direction parallel to the gate structures (e.g., along the Y axis). In another example, the interconnect structures 1110, 1112, and 1116, formed as via structures, can electrically couple to the MD's 1102, 1106, and 1108, respectively, which are sometimes referred to as VD's 1102, 1112, and 1116. In yet another example, the interconnect structure 1114, formed as a via structure, can electrically couple to the metal gate structure 1008, which is sometimes referred to as VG 1114. In some embodiments, each of the VD's 1102, 1112, and 1116 and VG 1114 can extend through an ILD 1120 (disposed above the ILD 920) to be in contact with the corresponding MD or metal gate structure.

In some embodiments, some of the MD's formed in the area 704A may each function as one of the electrodes of a third type of interlayer decoupling capacitor. A portion of the ILD 1120 disposed over such an MD can function as a dielectric medium of this type of interlayer decoupling capacitor. Details of such interlayer decoupling capacitors will be discussed below.

Figure 12:
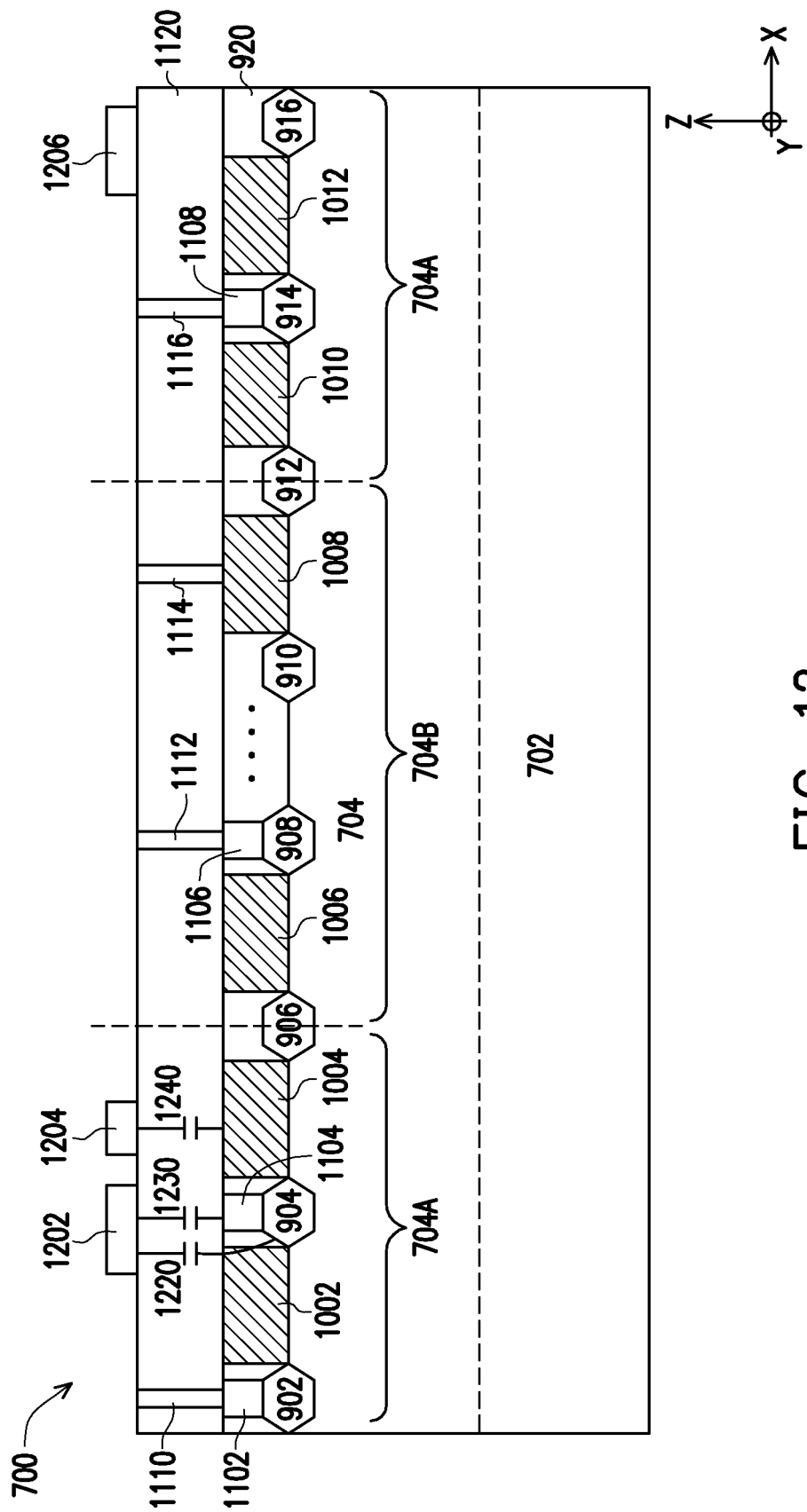

Referring to FIGS. 6 and 12, the method 600 proceeds to operation 612 in which a number of BEOL interconnect structures 1202, 1204, and 1206 are formed, in accordance with some embodiments. The cross-sectional view of semiconductor device 700 shown in FIG. 12 may be cut along a lengthwise direction of the active region 704 (e.g., the X axis indicated in FIG. 2A).

The interconnect structures 1202 to 1206, formed of one or more metal materials (e.g., tungsten (W), copper (Cu), gold (Au), cobalt (Co), Ruthenium (Ru), or combinations thereof), is formed to electrically couple to one or more of the FEOL features (e.g., metal gate structures, source/drain structures) through the above-described MEOL interconnect structures. The interconnect structures 1202 to 1206 generally extend along a direction perpendicular to a lengthwise direction of the gate structures (e.g., along the X axis). The interconnect structures 1202 to 1206 are formed in the bottommost one of a number of BEOL layers (e.g., the next upper layer over the ILD 1120), which are sometimes referred to as M0's 1202, 1204, and 1206.

According to various embodiments, a first interlayer decoupling capacitor 1220 that have the source/drain structure 904, the ILD 920 and ILD 1120, and the M0 1202 as its first electrode, dielectric medium, and second electrode, respectively, can be formed; a second interlayer decoupling capacitor 1230 that have the MD 1104, the ILD 1120, and the M0 1202 as its first electrode, dielectric medium, and second electrode, respectively, can be formed; and a third interlayer decoupling capacitor 1240 that have the metal gate structure 1004, the ILD 1120, and the M0 1204 as its first electrode, dielectric medium, and second electrode, respectively, can be formed. Further, to minimize their leakage current, one of the electrodes of each of these interlayer decoupling capacitors is electrically tied to either VDD or VSS. For example, the source/drain structure 904 of the interlayer decoupling capacitor 1220 is electrically tied to either VDD or VSS; the MD 1104 of the interlayer decoupling capacitor 1230 is electrically tied to either VDD or VSS; and the gate structure 1004 of the interlayer decoupling capacitor 1240 is electrically tied to either VDD or VSS.

In one aspect of the present disclosure, a semiconductor is disclosed. The semiconductor device includes a substrate. The semiconductor device includes an active region disposed over the substrate. The active region extends along a first lateral direction. The semiconductor device includes a plurality of first conductive structures operatively coupled to the active region. The plurality of first conductive structures extend along a second lateral direction perpendicular to the first lateral direction. The semiconductor device includes a plurality of second conductive structures disposed above the plurality of first conductive structures. The plurality of second conductive structures extend along the first lateral direction. The semiconductor device includes a first capacitor having a first electrode and a second electrode. The first electrode includes one of the plurality of first conductive structures and the active region, and the second electrode includes a first one of the plurality of second conductive structures. Each of the active region and the plurality of first conductive structures is electrically coupled to a power rail structure configured to carry a supply voltage.

In another aspect of the present disclosure, a semiconductor device is disclosed. The semiconductor device includes a first semiconductor channel extending along a first lateral direction. The semiconductor device includes a first epitaxial semiconductor structure coupled to an end of the first semiconductor channel. The semiconductor device includes a first interconnect structure electrically coupled to the first epitaxial semiconductor structure. The first interconnect structure extends along a second lateral direction perpendicular to the first lateral direction. The semiconductor device includes second interconnect structure vertically disposed above the first interconnect structure. The second interconnect structure extends along the first lateral direction. The semiconductor device includes a first decoupling capacitor having a first electrode and a second electrode. The first and second electrodes are formed by the first interconnect structure and the second interconnect structure, respectively. Each of the first epitaxial semiconductor structure and the first interconnect structure is electrically fixed at a supply voltage.

In yet another aspect of the present disclosure, a method for fabricating decoupling capacitors is disclosed. The method includes forming an active region over a substrate, wherein the active region extends along a first lateral direction. The method includes forming a plurality of first metal structures extending along a second lateral direction over the active region. The first metal structures are operatively coupled to respective portions of the active region. The method includes forming a plurality of second metal structures extending along the first lateral direction over the first metal structures. The second metal structures are separated from the first metal structures with at least one dielectric layer. The method includes forming a plurality of interlayer decoupling capacitors between the second metal structures and the first metal structures and/or between the second metal structures and the active region based on coupling the active region and the plurality of first metal structures to a structure that carries a supply voltage.

In yet another aspect still of the present disclosure, a method for fabricating decoupling capacitors is disclosed. The method includes forming a plurality of epitaxial structures extending in a first direction. The method includes forming a plurality of metal gate structures over the plurality of epitaxial structures, each of the metal gate structures extending in a second direction, perpendicular to the first direction. The method includes forming an interconnect over a first portion of the plurality of epitaxial structures and a second portion of the plurality of epitaxial structures, the first portion of the plurality of epitaxial structures and the second portion of the plurality of epitaxial structures bounding a third portion of the plurality of epitaxial structures along the first direction, the interconnect comprising a plurality of electrodes for a plurality of decoupling capacitors. The method includes forming a plurality of dielectric layers comprising a dielectric of the plurality of decoupling capacitors.

In a further aspect of the present disclosure, a method for voltage regulation is disclosed. The method includes conditioning a supply voltage for a circuit. The circuit can include a first semiconductor channel extending along a first lateral direction. The circuit can include a first semiconductor structure coupled to an end of the first semiconductor channel. The circuit can include a first interconnect structure electrically coupled to the first semiconductor structure, wherein the first interconnect structure extends along a second lateral direction perpendicular to the first lateral direction. The circuit can include a second interconnect structure vertically disposed above the first interconnect structure, wherein the second interconnect structure extends along the first lateral direction. The circuit can include a first decoupling capacitor disposed in a first area of a substrate, and having a first electrode and a second electrode. The first and second electrodes are formed by the first interconnect structure and the second interconnect structure, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating decoupling capacitors, comprising:
    forming an active region over a substrate, wherein the active region extends along a first lateral direction;
    forming a plurality of first metal gate structures extending along a second lateral direction over the active region, wherein the plurality of first metal gate structures are operatively coupled to respective portions of the active region;
    forming a plurality of second metal structures extending along the first lateral direction over the plurality of first metal gate structures;
    forming a plurality of third metal structures extending along the second lateral direction over the plurality of second metal structures; and
    forming at least one dielectric layer to define a plurality of interlayer decoupling capacitors between first electrodes coupled with a first power rail structure that carries a first supply voltage and second electrodes coupled with a second power rail structure that carries a second supply voltage, the first electrodes comprising:
        a first set of the plurality of first metal gate structures and a first set of the plurality of second metal structures and a first set of the third metal structures;
        and the second electrodes comprising:
        a second set of the plurality of second metal structures and a second set of the third metal structures.

2. The method of claim 1, further comprising forming a second plurality of interlayer decoupling capacitors between the plurality of second metal structures and the active region.

3. The method of claim 2, wherein forming the plurality of second metal structures comprises forming second decoupling capacitors having a third electrode and a fourth electrode, wherein the third electrode includes one of the plurality of second metal structures, and the fourth electrode includes a second one of the plurality of second metal structures.

4. The method of claim 2, further comprising forming an additional plurality of second metal structures disposed, along the first lateral direction, between a first portion of the plurality of second metal structures and a second portion of the plurality of second metal structures, wherein:
the first portion of the plurality of second metal structures is disposed closer to a first edge of the active region than the additional plurality of second metal structures; and
the second portion of the plurality of second metal structures is disposed closer to a second edge of the active region than the additional plurality of second metal structures, the second edge of the active region disposed opposite from the first edge along the first lateral direction.

5. The method of claim 1, further comprising:
forming a source/drain structure in the active region;
forming a channel in the active region coupled to the source/drain structure; and
forming an active transistor based on the source/drain structure, the channel, and at least one of the plurality of first metal gate structures, wherein the active transistor is configured to operate a voltage not greater than 0.9 volts.

6. The method of claim 5, wherein forming the active transistor comprises:
growing, epaxially, a plurality of epitaxial semiconductor structures; and
electrically connecting the first metal gate structures to at least one of the plurality of epitaxial semiconductor structures.

7. The method of claim 1, wherein the active region comprises a fin structure protruding from the substrate.

8. The method of claim 1, wherein forming the active region comprises forming a plurality of nanostructures over the substrate.

9. The method of claim 8, wherein forming the nanostructures comprises:
forming a plurality of vertically spaced nanosheet to form a nanosheet stack; and
etching, vertically, the nanosheet stack to form the plurality of nanostructures.

10. The method of claim 1, further comprising forming a third metal structure along the first lateral direction, the third metal structure configured to convey the first supply voltage or the second supply voltage.

11. The method of claim 10, wherein the third metal structure is vertically disposed opposite the substrate from the plurality of second metal structures.

12. A method for fabricating decoupling capacitors, comprising:
forming, over an active region extending along a first lateral direction, a plurality of first metal gate structures extending along a second lateral direction wherein the plurality of first metal gate structures are operatively coupled to respective portions of the active region;
forming a plurality of second metal structures extending along the first lateral direction over the plurality of first metal gate structures;
forming a transistor in the active region, a source/drain structure of the transistor electrically coupled with at least one of the plurality of first metal gate structures or the plurality of second metal structures;
forming a plurality of third metal structures extending along the second lateral direction over the plurality of second metal structures; and
forming at least one dielectric layer to define a plurality of interlayer decoupling capacitors between first electrodes coupled with a first power rail structure that carries a first supply voltage and second electrodes coupled with a second power rail structure that carries a second supply voltage, the first electrodes comprising:
a first set of the plurality of first metal gate structures and a first set of the plurality of second metal structures and a first set of the third metal structures; and the second electrodes comprising:
a second set of the plurality of second metal structures and a second set of the third metal structures.

13. The method of claim 12, further comprising forming the active region over a substrate, the active region comprising a plurality of nanosheet sublayers.

14. The method of claim 12, wherein forming the transistor comprises:
forming a source structure and a drain structure in the active region;
forming a channel in the active region coupled with the source structure and the drain structure; and
coupling the source structure or the drain structure with at least one of the plurality of first metal gate structures, wherein the transistor is configured to operate a voltage not greater than 0.9 volts.

15. The method of claim 12, comprising:
forming a plurality of dummy gates over the active region;
growing, epaxially, a plurality of epitaxial semiconductor structures between the plurality of dummy gates; and
forming one or more of the first metal gate structures laterally defined by a location one of the plurality of dummy gates.

16. The method of claim 12, wherein the active region comprises a fin structure protruding from a substrate.

17. The method of claim 12, wherein forming the active region comprises forming a plurality of nanostructures over a substrate.

18. A method for fabricating decoupling capacitors, comprising:
forming an active region extending along a first lateral direction;
forming, in the active region, a semiconductive channel;
forming a plurality of first metal structures extending along a second lateral direction over the active region, wherein a first metal structure of the plurality of first metal structures are operatively coupled with an end of the semiconductive channel;
forming a plurality of second metal structures extending along the first lateral direction over the plurality of first metal structures; and
forming a plurality of interlayer decoupling capacitors comprising:
at least one dielectric layer between the second metal structures and the plurality of first metal structures;
a first set of the interlayer decoupling capacitors, coupled with a first supply voltage at a first terminal and one of a plurality of decoupling nodes at a second terminal; and
a second set of the interlayer decoupling capacitors, coupled with a second supply voltage at the first terminal and one of the plurality of decoupling nodes at the second terminal.

19. The method of claim 18, further comprising:
coupling the active region and the plurality of first metal structures to a structure that carries a supply voltage to form a second plurality of interlayer decoupling capacitors between the second metal structures and the active region.

\* \* \* \* \*